United States Patent [19]
Norris

[11] 4,176,285
[45] Nov. 27, 1979

[54] ELECTRICAL PULSE GENERATOR

[75] Inventor: Neil J. Norris, Santa Barbara, Calif.

[73] Assignee: The United States of America as represented by the United States Department of Energy, Washington, D.C.

[21] Appl. No.: 868,584

[22] Filed: Jan. 11, 1978

[51] Int. Cl.² .......................... H03K 3/02; H03K 6/00
[52] U.S. Cl. ..................................... 307/106; 333/20; 328/65
[58] Field of Search ................. 307/106, 303; 333/20, 333/23, 27; 328/65

[56] References Cited

U.S. PATENT DOCUMENTS

| 3,381,245 | 4/1968 | Guanella | 333/20 |
| 3,668,416 | 6/1972 | Marilleau | 307/106 |

FOREIGN PATENT DOCUMENTS

| 747016 | 11/1966 | Canada | 307/106 |
| 763537 | 7/1967 | Canada | 307/106 |

OTHER PUBLICATIONS

A Helical Pulse-Voltage Generator, A. B. Gerasimov et al., Instrum. & Exp. Techniques (USA), No. 3, May–Jun. 1970, pp. 819–821.

*Primary Examiner*—L. T. Hix
*Assistant Examiner*—S. D. Schreyer
*Attorney, Agent, or Firm*—Dean E. Carlson; John A. Koch

[57] ABSTRACT

A technique for generating high-voltage, wide dynamic range, shaped electrical pulses in the nanosecond range. Two transmission lines are coupled together by resistive elements distributed along the length of the lines. The conductance of each coupling resistive element as a function of its position along the line is selected to produce the desired pulse shape in the output line when an easily produced pulse, such as a step function pulse, is applied to the input line.

5 Claims, 5 Drawing Figures

ELECTRICAL PULSE GENERATOR

BACKGROUND OF THE INVENTION

The invention described herein was made in the course of or under Contract EY-76-C-08-1183 with the U.S. Department of Energy.

This invention relates to the generation of electrical pulses and more particularly to a technique for generating an electrical pulse of desired shape. Even more particularly, this invention relates to a technique for generating a pulse having an increasing pulse amplitude as a function of time.

Many applications exist for pulse generators which are capable of producing a well-defined voltage function of a desired shape. It is important in a number of these applications that the output pulse have wide dynamic range, high-voltage capability, and excellent pulse-to-pulse reproducibility. One such application is in the simulation of the electrical signal from a detector driven by a nuclear explosion. The ability to simulate such signal aids in the development and testing of instrumentation used to monitor tests of nuclear explosives. Instruments to measure and record electrical pulse signals of a particular shape require that a test pulse having similar shape and amplitude be used for their test and calibration. Such instruments are designed and used to monitor nuclear reactions but are also useful in measuring other phenomena, including pulsed accelerators, lasers, and other laboratory research devices.

Prior techniques for generating specially shaped high-voltage pulses have generally used resistive-capacitive networks which use diodes, transistors, or other active devices to determine the pulse shape. These generally produce pulse shapes which have undesirable variations in rate of voltage change, have limited dynamic range, and are not highly reproducible. Transmission lines have also been used to shape pulses, primarily by storing energy in a coaxial line which is switched into a load by a fast switch. Pulses produced in this way normally have a nearly linear rise front and a more or less flat top, but cannot be designed to produce a rise front that increases exponentially (or approximately so) with time. This invention provides a technique capable of producing pulses whose rate of rise increases with time, using an easily generated flat top pulse as the input to a passive transmission line network.

BRIEF SUMMARY OF THE INVENTION

Accordingly, it is an object of the invention to provide a technique for generating high-voltage, wide dynamic range, shaped pulses which overcomes many of the disadvantages of techniques previously used.

Briefly summarized, the above and additional objects are accomplished by utilizing a pair of electrically conductive transmission lines which are resistively coupled together by a plurality of resistive elements, the value of the conductance of each of the resistive couplings being a function of its position along the line, to produce the desired pulse shape at one of the lines upon the application of an easily produced pulse to the other line. This technique offers these advantages over other techniques:

1. It is a completely passive system which gives excellent pulse-to-pulse reproducibility.

2. It allows considerable pulse shape adjustment to match a desired function by adjusting the coupling resistance function.

3. It is capable of large (several decades) dynamic range.

4. It is capable of high pulse voltages, variable in proportion to input pulse amplitude.

5. It allows some output pulse shape changes by shaping the input pulse.

6. Its repetition rate is limited only by input pulse capabilities and heat dissipation capabilities of the resistive elements.

7. The active pulse length is in the nanosecond range, limited only by the physical length of the coupled lines.

As an example, if it is desired to generate an exponential pulse $$V(t) = V_0 e^{\alpha t}$$

where
$V_0$ is some initial voltage
$\alpha$ is in generations/nanosecond and
t is time in nanoseconds,
the conductance, Y(mhos), between the lines is adjusted to be $$Y(Z) = Y_0 e^{\beta Z}$$

where $Y_0$ is the conductance at the input, and $$\beta = \frac{\alpha \sqrt{\epsilon}}{15}$$

where
Z = distance from input (cm) and
$\epsilon$ = dielectric constant of the material.

A fast-rising step function voltage pulse is applied to the input line, generating a pulse in the output line that increases with time because increasing current is coupled from input line to output line as the pulse travels down the input line. The output pulse will follow the conductance function for a time equivalent to the region where $$Y << (1/Z_0),$$

where $Z_0$ is the characteristic impedance of the line. The total time duration (in nanoseconds) will be $$\tau = \frac{2\sqrt{\epsilon} L}{c} = \frac{\sqrt{\epsilon} L}{15}$$

where
L = length of transmission line (cm)
c = velocity of light = 30 cm/ns
and the shape of the pulse for longer times depends upon the termination of the lines. In the region where the conductance is approximately equal to the characteristic impedance of the lines, either the conductance function, the line impedance, or both, can be modified to give the desired pulse shape.

The output pulse is determined by the mathematical convolution of the distributed conductance function and the applied voltage pulse. This feature allows some variability of the output pulse by changing the shape of the input pulse. As an example, suppose a rising exponential voltage pulse is desired, but with a variable exponential function. The coupled lines can be built to give the highest desired exponential when a step function waveform is applied, and lower values of the exponential can be obtained by applying an input pulse which has a fast rise and a decaying exponential shape (as is easily obtained from a capacitor discharged by a fast switch). Many other easily reproducible input voltage pulse shapes can be used to obtain a range of output voltage pulse shapes having a large dynamic range, but still using the same passive transmission line network.

The above-mentioned and additional objects, advantages, and applications of the invention and a further understanding of the invention will be apparent after consideration of the following description of a preferred embodiment described in conjunction with the accompanying drawings.

DETAILED DESCRIPTION OF THE INVENTION

Figure 1:
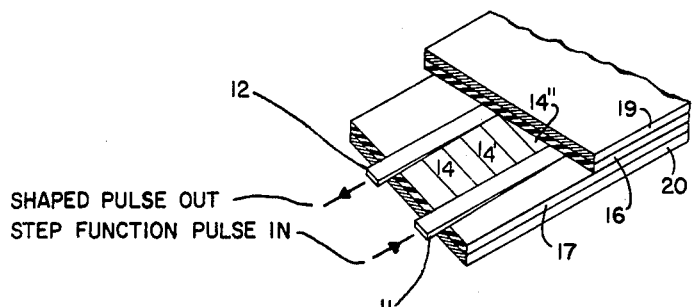
FIG. 1 is a partially broken away view of an embodiment of a pulse generator in accordance with the invention.

Referring now to FIG. 1, a pair of longitudinally extending electrically conductive strips 11 and 12 are conductively coupled together by a plurality of transversely extending distributed resistive film elements 14, 14', 14"..., along the entire length of the conductive strips. Strips 11 and 12 are approximately parallel, thereby establishing similar length and shapes of the resistive film elements along the length of the strips. Resistive film elements 14, 14', 14", etc., are positioned between conductive strips 11 and 12 in as close a proximity to each other as necessary to produce the desired conductance function with length between strips 11 and 12. In some applications, a continuous resistive film could be utilized along some part (or all) of the length of transmission lines 11 and 12 in order to achieve the desired conductance function.

The conductive strips and connecting film elements are enclosed on either side by dielectric materials 16 and 17, whose thickness and dielectric constant are chosen to provide the desired impedance of the transmission line formed by strip 11 or 12, the dielectric materials 16 and 17, and the conducting ground plane sheets 19 and 20.

In a demonstration of the pulse generator in accordance with a particular embodiment of FIG. 1 to produce an approximately exponential pulse, a 12-foot assembly of copper strips 11 and 12, plastic foam dielectrics 16 and 17, and aluminum ground plane sheets 19 and 20 were utilized. The resistive couplings between strips 11 and 12 were obtained by painting conductive ink to form resistive film elements 14, 14',14", etc., between the strips at approximately 6-inch (15-cm) intervals. The conductance of the particular resistive elements was adjusted, such as by altering the size, using different materials, etc., as a function of length to approximate an exponential increase in conductance with distance. The desired and actual conductance values of those resistance elements are shown in graphical form in FIG. 2.

The 12-foot copper lines 11 and 12 were each ½ inch wide by 0.010 inch thick and the distance between each of them and the ground planes 19 and 20 was adjusted to provide a transmission line impedance of 50 ohms. The two layers of dielectric materials 16 and 17 were polyvinyl chloride film encapsulating a plurality of air bubbles, approximately ¼ inch thick.

Figure 3:
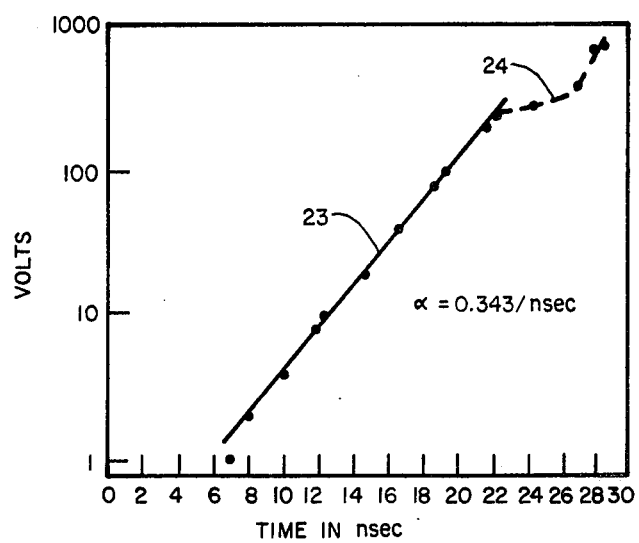
FIG. 3 is a graphical representation of the measured output pulse from an embodiment according to FIG. 1 having the conductance values shown on FIG. 3, and FIGS. 4 and 5 are additional embodiments of a pulse generator in accordance with the invention in more compact configurations than that of FIG. 1.

A fast-rising step function voltage pulse was applied to one end of one of the strips 11 to produce an output pulse, which is represented by 23 on the graph of FIG. 3, at the same end of the other strip 12. Calibrated oscilloscopes and precision attenuators were used to record the output pulse on photographic film. Voltage points at particular times were determined by reading the film and plotted on semilogarithmic graph paper. FIG. 3 is a reproduction of that graph.

Figure 2:
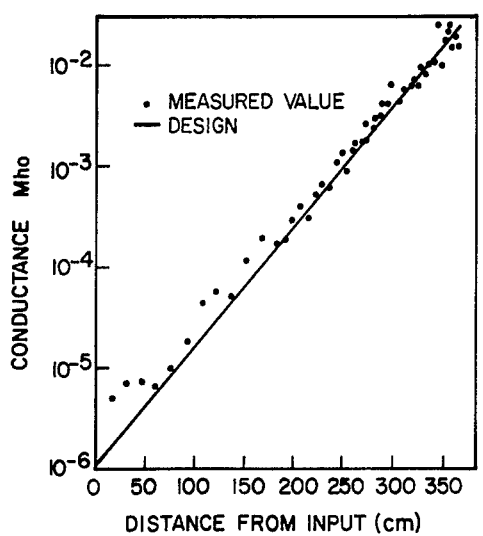
FIG. 2 is a graphical representation of the design and measured values of conductance as a function of length to approximate an exponential in the embodiment of FIG. 1.

A comparison of output pulse 23 of FIG. 3 with the conductance values for the film elements in FIG. 2 shows that the output pulse followed the approximately exponential shape of the conductance values for over several decades. While the shape of the FIG. 3 curve was not perfectly exponential in region 24 for the particular embodiment demonstrated, compensation can be readily made in that regard. The deviation from the exponential at 24 occurred in the region where the high conductance between strips 11 and 12 provided by the resistive couplings affected the natural impedance of the line, i.e., the impedance between the two strips 11 and 12. However, the line impedance and/or conductance values in this region can be selected to compensate for this conductance effect.

The desired pulse shape can be obtained to any desired accuracy provided sufficient care is taken in tailoring strips 11 and 12 and conductive coupling elements 14, 14', 14", etc. Since the system is linear and entirely passive, the output pulse shape will be exactly the same from pulse to pulse if the input remains exactly the same. On the other hand, as indicated above, variation in the output can be obtained by changing the shape of the input pulse. Moreover, inductance, discontinuities, and other discrete components can be placed at certain points in the assembly to obtain certain special voltage pulse shapes such as double valued functions, as an example.

Figure 4:
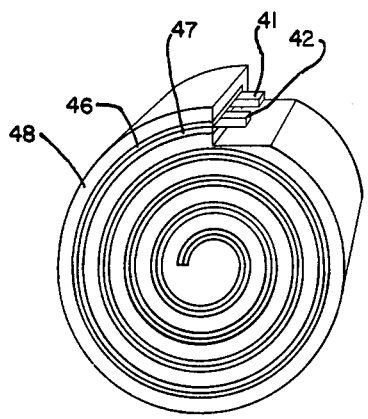

A more compact arrangement of the pulse generator is shown in FIG. 4. Conductive strips 41 and 42 coupled by resistive strips (not shown) in the manner described in connection with FIG. 1 are curvilinearly extending, being positioned within a spiral groove 46 machined into an aluminum block 48. In this embodiment, block 48 serves as the ground plane. As in the case of the FIG. 1 embodiment, dielectrics 46' and 47' separate conductive strips 41 and 42 from the ground plane. Strip lines 41 and 42 may be deposited by any conventional method such as vacuum deposition or sputtering on a flexible plastic dielectric, such as Mylar (or equivalent), sheet. High voltage could readily be accommodated in the configuration by selecting the conductive strips and resistive coupling elements to resist voltage breakdown and, if necessary, using oil as a dielectric insulator.

Figure 5:
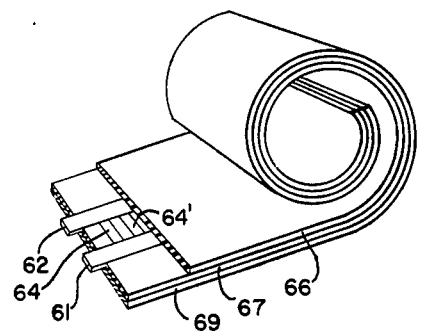

FIG. 5 shows another alternative, more compact arrangement. The spirally rolled assembly shown in FIG. 5 can be obtained by mounting flexible conducting stripes 61 and 62 and resistive film coupling elements 64, 64', etc., on a flexible dielectric sheet and rolling them, along with flexible metal ground plane 69 and dielectric spacers 66 and 67, into the approximately spiral configuration shown.

While the fundamental novel features of the invention have been shown and described and pointed out as applied to particular embodiments by way of example, it will be appreciated by those skilled in the art that various omissions, substitutions, and changes may be made within the principle and scope of the invention as expressed in the appended claims.

What I claim is:

1. In a technique for generating a highly reproducible, high voltage, dynamic range electrical pulse having an increasing pulse amplitude as a function of time by a completely passive system, the apparatus comprising a ground plane, a pair of conductors of selected length separated from said ground plane by a suitable dielectric, and a plurality of entirely passive, entirely resistive elements positioned along said length each of which couples said pair of conductors, the conductance of each of said passive resistive elements increasing with position along said length whereby the application of a step function pulse to one of said conductors produces said pulse having an increasing pulse amplitude with time as an output at the other of said conductors.

2. The apparatus of claim 1 wherein said conductors are generally parallel and longitudinally extending.

3. The apparatus of claim 1 wherein said conductors are curvilinearly extending.

4. The apparatus of claim 3 wherein said conductors extend in a curvilinear manner approximating a spiral.

5. The apparatus of claim 1 wherein said increase of conductance with length approximates an exponential function.

* * * * *